United States Patent [19]

Wong

[11] Patent Number: 4,891,571
[45] Date of Patent: Jan. 2, 1990

[54] CONTROL DEVICE FOR SWITCHING A THYRISTOR

[76] Inventor: Tak-Tai Wong, Block A, 20th Flr., Braenar Hill Mansion, 43 Braenar Hill Road, North Point, Hong Kong

[21] Appl. No.: 224,902

[22] Filed: Jul. 27, 1988

[30] Foreign Application Priority Data

Jul. 29, 1987 [CN] China .................................. 87105303

[51] Int. Cl.$^4$ .............................................. G05F 1/455
[52] U.S. Cl. ..................................... 323/322; 323/326; 323/241
[58] Field of Search ................ 323/321, 322, 323, 324, 323/326, 239, 241, 242, 319, 235

[56] References Cited

U.S. PATENT DOCUMENTS

| | | | |
|---|---|---|---|
| 3,562,625 | 2/1971 | Van Den Broek | 363/87 |
| 3,691,452 | 9/1972 | Aguiar | 323/322 |
| 3,909,703 | 9/1975 | Braddock | 323/322 |
| 3,990,000 | 11/1976 | Digneffe | 323/322 |
| 4,287,468 | 9/1981 | Sherman | 323/322 |
| 4,337,509 | 6/1982 | Omae et al. | 323/241 |

FOREIGN PATENT DOCUMENTS 3122280 6/1980 Fed. Rep. of Germany .

OTHER PUBLICATIONS

H. Dowalski, "Preparation Schwingungspaketsteuerung mit triacs", vol. 29, No. 7, Radio Fernsehen Elektronik, Jul. 1980.

Primary Examiner—Peter S. Wong
Attorney, Agent, or Firm—Pravel, Gambrell, Hewitt, Kimball & Krieger

[57] ABSTRACT

A control device for switching a thyristor in a circuit including an a.c. voltage source, which comprises firing signal circuit having an input for receiving control signals, an output for providing firing signals for a thyristor and a detector for detecting zero-crossings of an a.c. voltage provided by the a.c. voltage source. The firing signal circuit further comprises an accumulating circuit for accumulating the control signals and for providing a firing signal when both the detector detects a zero-crossing of the a.c. voltage and the value of the accumulated signals is equal to or exceeds a first predetermined value, and subtracting circuit for subtracting a second predetermined value from the value of the accumulated signals when the firing signal is provided.

15 Claims, 2 Drawing Sheets

CONTROL DEVICE FOR SWITCHING A THYRISTOR

FIELD OF THE INVENTION

The present invention relates to a control device for switching a thyristor or the like.

DESCRIPTION OF PRIOR ART

Thyristors are generally used for controlling the rms value of an a.c. voltage, or the average power, applied to a load. The thyristors are turned on to supply voltage to the load when the a.c. supply voltage is at substantially zero level, i.e. zero-crossings, in order to minimise the introduction of interference. The thyristors are turned on for a certain number of cycles of the a.c. supply voltage in order to provide a smaller rms value a.c. voltage across the load, for example the thyristors will be turned on for one cycle in every two to provide half the supply voltage level.

Ideally, the turn-on and turn-off cycles of the thyristor should be distributed evenly over time. In known arrangements, a certain time base is selected, for example 100 cycles of the mains supply voltage, and the percentage of cycles during which the thyristor is turned on to supply voltage to the load determines the desired rms value of the load voltage. However, uniform distribution of the turn-on cycles of the thyristor through the 100 cycle time period can be obtained only when the number of turn-on cycles, which corresponds to the desired rms value of the load voltage, is an integral factor of 100, for example 10, 20 or 25. For a non-integral factor, say 33 (33 percent), the turn-on cycles may be located either at the beginning or at the end of the 100 cycles. This will cause a large fluctuation of the load voltage. A longer fixed time base can be selected to provide a larger number of settings of load voltage in which uniform distribution of the turn-on cycles of the thyristor can be obtained, but the system cannot provide for even distribution of the turn-on cycles at all factors or percentages of the supply voltage.

SUMMARY OF THE INVENTION

The present invention provides a control device for switching a thyristor or the like in a circuit including an a.c. voltage source, comprising firing signal means having an input for receiving control signals, an output for providing firing signals for a said thyristor, and a detector for detecting zero-crossings of an a.c. voltage provided by the a.c. voltage source, wherein said firing signal means further comprises accumulating means for accumulating the control signals and for providing a said firing signal when both the detector detects a zero-crossing of the a.c. voltage and the value of the accumulated control signals is equal to or exceeds a first predetermined value, and subtracting means for subtracting a second predetermined value from the value of the accumulated control signals when a said firing signal is provided.

In a first preferred embodiment of a control device of the invention for use in an analogue circuit, said firing signal means comprises an electric charge balance voltage-to-frequency converter which is synchronised with the zero-crossings of the a.c. voltage to provide said firing signals at the zero-crossings.

In a second preferred embodiment of a control device of the invention for use in a logic circuit, said firing signal means comprises a digital accumulator having an input for receiving the control signals and an output for providing the firing signal when the total value of accumulated control signals overflows a said first predetermined value, the operation of the accumulator being triggered by the detector.

In a third preferred embodiment of a control device of the invention for use in a microprocessor-based circuit, said firing signal means comprises a microprocessor-based circuit, which is programmable to accumulate the control signals, provide the firing signals, and subtract a said second predetermined value from the accumulated control signals.

Other, preferred and/or optional features of the invention will be apparent from the following description and the accompanying claims.

BRIEF DESCRIPTION OF THE DRAWINGS

FIG. 1 is a schematic circuit diagram of a first embodiment of a control device in accordance with the invention;

FIGS. 2(a), 2,(b) and 2(c) show signal waveforms at various circuit nodes of the control device of FIG. 1;

DESCRIPTION OF PREFERRED EMBODIMENTS

Figures 1, 2A, 2B, 2C:
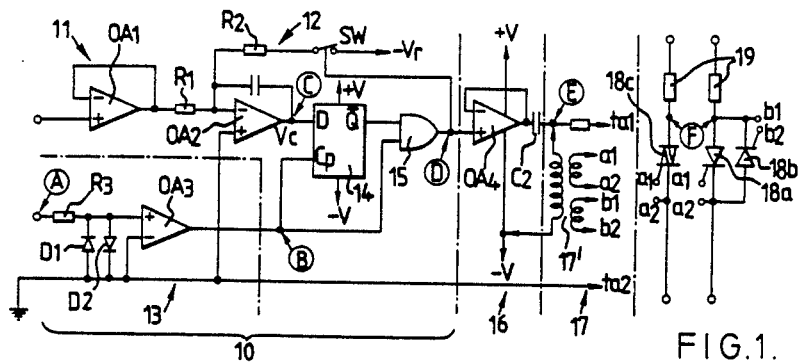

Referring now to FIG. 1 of the drawings, a first embodiment of a control device 10 shown therein comprises an input buffer 11, a voltage integrator circuit 12, a zero-crossing detector 13 and a data or D flip-flop 14. The input buffer 11 comprises an operational amplifier $OA_1$ having its negative input connected to its output. The operational amplifier $OA_1$ is arranged to receive a voltage control signal at its positive input.

The intergrator circuit 12 comprises an operational amplifier $OA_2$, two resistors $R_1$ and $R_2$ which are connected to the negative input of the operational amplifier $OA_2$, and a capacitor $C_1$ which is connected between the negative input and the output of the operational amplifier $OA_2$. The output of the operational amplifier $OA_1$ is connected to the negative input of the operational amplifier $OA_2$ via the resistor $R_1$. The positive input of the operational amplifier $OA_2$ is connected to earth. The integrator circuit 12 receives the voltage control signal from the input buffer 11, and accumulates it as electric charge in the capacitor $C_1$.

The zero-crossing detector 13 comprises an operational amplifier $OA_3$, and two diodes $D_1$ and $D_2$ which are connected in parallel and in opposite direction between the two inputs of the operational amplifier $OA_3$. The negative input of the operational amplifier $OA_3$ is connected to earth, and the positive input is arranged to receive via a resistor $R_3$ an a.c. voltage which is stepped down from and synchronised with a mains supply voltage. The detector 13 converts the a.c. voltage into a clock signal which is also in synchronism with the mains supply voltage.

The D flip-flop 14 receives the clock signal at its clock input $C_p$. The $\bar{Q}$ output of the D flip-flop 14 provides a logic output which is opposite to the logic input at the D input when the D flip-flop 14 is triggered by a leading edge of the clock signal. The $\bar{Q}$ output and the output of the detector 13 are respectively connected to two inputs of an AND gate 15, which in turn provides a firing signal for two thyristors 18a and 18b when both its inputs are at logic 1.

In use, the output of the AND gate 15 is connected to a driver 16 which comprises an operational amplifier $OA_4$ and a capacitor $C_2$. The operational amplifier $OA_4$ receives the firing signal at its positive input, and has its negative input connected to its output. The output of the operational amplifier $OA_4$ is connected via the capacitor $C_2$ to an interface circuit 17, which comprises a pulse transformer 17'. The pulse transformer 17' has two separate secondary windings each for connection to the gate and cathode of the thyristor 18a, 18b. The thyristors 18a and 18b are connected together in parallel and in opposite direction, and are connected in series with a load 19 across the mains supply voltage.

The driver circuit 16 converts, by means of the capacitor $C_2$, each firing pulse into two opposite polarity triggering pulses, corresponding to the leading and trailing edges of the firing pulse, at circuit node E for turning on the thyristors 18a and 18b, respectively. The interface circuit 17 serves to isolate the control device 10 and the driver circuit 16 from the thyristors 18a, 18b and the load 19, which are at a much higher voltage level, i.e. the mains voltage level.

The operation of the control device 10 is now described with reference to FIG. 2(a). The detector 13 receives the a.c. voltage at circuit node A, and provides the clock signal at circuit node B. The integrator circuit 12 receives the control signal from the input buffer 11, and accumulates the control signal as electric charge in the capacitor $C_1$. FIG. 2(a) shows the steady state condition in which the control signal is at its maximum level. The control signal, when being accumulated in the capacitor $C_1$ for half a clock cycle between adjacent clock pulses, will cause the capacitor $C_1$ to provide a capacitor voltage $V_c$ at circuit node C which decreases from a certain voltage level $V_1$ which is above a threshold level $V_{th}$ of the D input of the D flip-flop 14 down to below the threshold level $V_{th}$ at a voltage level $V_2$. The $\overline{Q}$ output of the D flip-flop 14 then goes logic 1 when the D flip-flop 14 is triggered by a next clock pulse. The $\overline{Q}$ output of the D flip-flop 14 will remain at logic 1 during the entire clock cycle. Simultaneously, the output of the AND gate 15 goes logic 1 and provides a firing pulse for the thyristors 18a and 18b during the presence of the clock pulse.

The resistor $R_2$ is connected to a fixed negative voltage $-V_r$ via an electronic switch SW, which can be triggered to close in response to the presence of the firing pulse. As the firing pulse will last for half a clock pulse, the capacitor $C_1$ will be discharged at the fixed negative voltage $-V_r$ for a fixed time period of half a clock cycle during the presence of the firing pulse. Therefore, at the end of the firing pulse, a fixed quantity of electric charge will have been removed from the capacitor $C_1$.

The arrangement is such that when the capacitor $C_1$ is being discharged, the capacitor voltage $V_c$ increases from the voltage level $V_2$ to the voltage level $V_1$. When the firing pulse finishes, the switch SW opens to cause the capacitor $C_1$ to be charged again by accumulating the control signal. When the next clock pulse arrives, the capacitor $C_1$ will be charged so as to provide a capacitor voltage $V_c$ again at the voltage level $V_2$, which is below the threshold level $V_{th}$. Therefore, the $\overline{Q}$ output will remain at logic 1 to provide another firing pulse during the next clock pulse.

It is apparent from above that when the control signal is at its maximum level, the control signal accumulated in the capacitor $C_1$ during charging is equal in quantity to the fixed quantity of electric charge which is removed from the capacitor $C_1$ during discharging, and the control device 10 operates to provide a firing pulse for every clock cycle. Under this condition, the two thyristors 18a, 18b conduct alternately for every cycle of the mains supply voltage. Therefore, the mains supply voltage is continuously applied across the load 19, as shown by the signal waveform at circuit node F.

FIG. 2(b) shows various signal waveforms when the control signal is at 76% of its maximum level. The initial conditions immediately before the first clock pulse arrives are taken such that the capacitor voltage $V_c$ is at a voltage level which is higher than the threshold level $V_{th}$, and the $\overline{Q}$ output is at logic 0. Therefore, when the first clock pulse arrives and during the first clock cycle of the clock signal, the $\overline{Q}$ output will remain at logic 0. Also, no firing signal is provided by the AND gate 15, the switch SW remains open, and the capacitor $C_1$ continues to accumulate the control signal.

When the second clock pulse arrives, the capacitor voltage $V_c$ decreases down to below the threshold level $V_{th}$, and hence the $\overline{Q}$ output goes logic 1. As the two inputs are at logic 1, the AND gate 15 provides a firing pulse to the driver circuit 16 and, in turn, the interface circuit 17 for triggering the thyristors 18a and 18b. Also, the switch SW closes to allow the capacitor $C_1$ to discharge a said fixed quantity of electric charge in the presence of the firing pulse, and during this time period the capacitor voltage $V_c$ will increase. At the end of the second clock pulse, the AND gate 15 ceases to provide the firing pulse and the switch SW is opened. The capacitor $C_1$ starts to accumulate the control signal again until the third clock pulse arrives.

As the control signal is at a level lower than its maximum level, the control signal accumulated in the capacitor $C_1$ between the second and the third clock pulses will be less than the fixed quantity of electric charge, which is removed from the capacitor $C_1$ during the presence of the second clock pulse. At the end of the second clock cycle the capacitor voltage $V_c$ will be below the threshold level $V_{th}$, but by a smaller amount than that at the end of the first clock cycle. This operation is repeated for the third and fourth clock cycles. There will thus be an increase in the capacitor voltage $V_c$ at the leading edges of the clock pulses. When the fifth clock pulse arrives, the capacitor voltage $V_c$ will be above the threshold level $V_{th}$, and hence the $\overline{Q}$ output goes logic 0 when the D flip-flop 14 is triggered by the leading edge of the fifth clock pulse.

At this instance, the capacitor $C_1$ starts to accumulate the control signal under the condition that the $\overline{Q}$ output of the D flip-flop is at logic 0, which is similar to the condition when the first clock pulse subsists. Thus the switch SW remains open and the capacitor $C_1$ continues to accumulate the control signal until the sixth clock pulse arrives and at this time the capacitor voltage $V_c$ decreases down to below the threshold level $V_{th}$. The D flip-flop 14 is then triggered by the leading edge of the sixth clock pulse to provide a logic 1 at the $\overline{Q}$ output. Therefore, another firing pulse is provided.

The arrangement is such that the operation repeats in a similar manner for the fifth to the eighth clock cycles as for the first to the fourth clock cycles, and also repeats in a similar manner for every subsequent group of four consecutive clock cycles until the 24th clock cycle. It is apparent from FIG. 2(b) that there is a general decreasing trend in the capacitor voltage $V_c$ between the successive groups of four clock cycles. The effect of the decreasing trend accumulates, and results in the capacitor voltage $V_c$ at the beginning of the 25th clock cycle being still below the threshold level $V_{th}$. Hence the $\overline{Q}$ output of the D flip-flop 14 remains at logic 1, and the capacitor $C_1$ discharges and charges for the 25th clock cycle as for the 24th clock cycle, providing an additional firing pulse. When the 26th clock pulse arrives, the capacitor voltage $V_c$ reaches a voltage level which is above the threshold level $V_{th}$ and is the same voltage level as immediately before the first clock pulse arrives.

It is apparent from FIG. 2(b) that there are 19 firing pulses over the first 25 clock cycles, each being converted by the driver circuit 16 into a pair of opposite polarity triggering pulses for turning on the thyristors 18a and 18b, respectively. The operation repeats in a similar manner for every subsequent group of 25 clock cycles. Therefore, the mains supply voltage is applied to the load 19 for 76% of its duration, and this corresponds to the control signal which is selected at 76% of its maximum level, the maximum level corresponding to the continuous application of the mains voltage to the load 19.

FIG. 2(c) shows various signal waveforms when the control signal is selected at 49% of its maximum level. It is apparent that 49 firing pulses are provided for every 100 clock cycles of the mains supply voltage, corresponding to the selected control signal level.

The voltage integrator circuit 12 is in effect an electric charge balance voltage-to-frequency converter, in which the resultant electric charge going into and coming out of the capacitor $C_1$ is zero, and the frequency of the output firing signal is determined by the magnitude of the input control signal.

Figure 3:
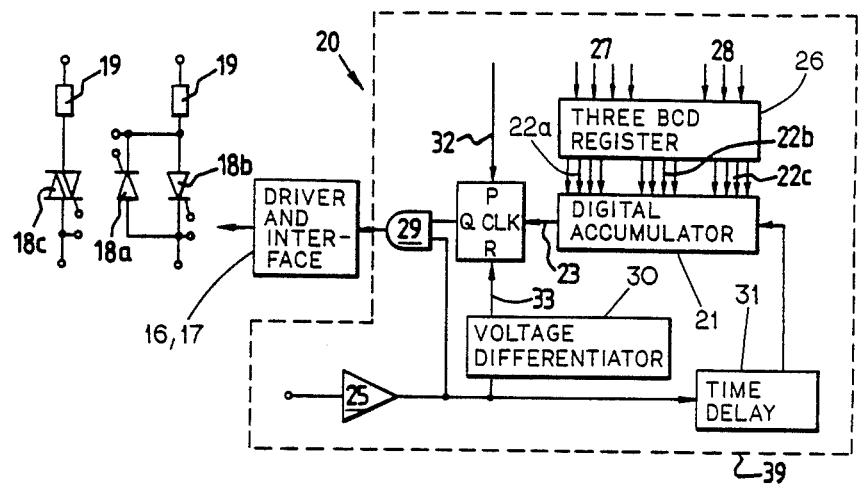
FIG. 3 is a schematic circuit diagram of a second embodiment of a control device in accordance with the invention.

A second embodiment of a control device 20 shown in FIG. 3 is implemented by a logic circuit 39. The control device 20 comprises a digital accumulator 21 having twelve input pins 22, one carry output pin 23 and a clock input pin, a toggle or T flip-flop 24, and a zero voltage comparator 25. The input pins 22 of the accumulator 21 are divided into three groups 22a, 22b and 22c of four pins for receiving a three binary-coded-decimal or BCD digit control signal. To facilitate the input of the control signal, a three BCD digit register 26 is connected to the input pins 22 of the accumulator 21. The register 26 has one group of four input pins 27 for receiving sequentially the three BCD digits of the control signal, and three select pins 28 for connecting the input pins 27 sequentially to the three groups 22a, 22b and 22c of input pins of the accumulator 21 when the input pins 27 receive sequentially the three BCD digits of the control signal.

The carry output pin 23 provides an overflow signal when the accumulated value in the accumulator 21 is equal to or exceeds a base value of, for example, 1000, and is connected to the input of the T flip-flop 24. The outputs of the T flip-flop 24 and the zero voltage comparator 25 are connected respectively to two inputs of an AND gate 29, which provides a firing pulse at its output only when both its inputs are at logic 1. The output of the zero voltage comparator 25 is connected also to a clear input 33 of the T flip-flop 24 via a differentiator 30, and the clock input of the accumulator 21 via a time delay element 31, both being responsive to a trailing edge of a signal received from the zero voltage comparator 25.

The AND gate 29 is connected at its output to the driver and interface circuit 16, 17 and, in turn, to the thyristors 18a, 18b, in a manner similar to that of the arrangement in FIG. 1. The thyristors 18a and 18b control the connection of the mains supply voltage to the load 19.

The zero voltage comparator 25 detects the zero-crossings of the mains supply voltage by receiving a lower a.c. voltage signal which is synchronised with the mains supply voltage. The output of the zero voltage comparator 25 provides a clock signal.

The accumulator 21 accumulates a selected BCD control signal appearing on the input pins 22 whenever the clock input receives a trailing edge of a clock pulse. In use, assuming that a 76% rms load voltage is required from the mains supply, a control signal of 760 is applied, with respective digits, to the input pins 22a, 22b and 22c by means of the register 26. The accumulated value of the accumulator 21 is initially reset to zero, and the output of the T flip-flop 24 is initially at logic 0. When the first clock pulse arrives, no firing pulse is provided by the AND gate 29 as one of its inputs, which is connected to the T flip-flop 24, is at logic 0. When the first clock pulse finishes, the output of the T flip-flop 24 is immediately reset to logic 0 by a narrow impulse received from the differentiator 30, which corresponds to the trailing edge of the clock pulse.

The time delay element 31 provides a short delay in time, for example 0.1ms, for the clock input of the accumulator 21 to receive the clock pulse. This ensures that the output of the T flip-flop 24 is reset to logic 0 before the accumulator 21 operates. When the accumulator 21 is eventually triggered by the trailing edge of the clock pulse, it adds 760 into its internal memory and the accumulated value becomes 760. No overflow occurs, and the T flip-flop 24 does not toggle, leaving its output at logic 0. As a result, no firing pulse is provided and neither thyristor 18a, 18b conducts.

The operation repeats for the second clock pulse as for the first clock pulse, except the accumulated value in the accumulator 21 now becomes 1,520 shortly, i.e. 0.1ms, after the second clock pulse finishes and overflow occurs. Hence the T flip-flop 24 toggles to provide a logic 1 at its output. This results in a firing pulse being provided by the AND gate 29 when the third clock pulse arrives, and the firing pulse is transferred to the driver and interface circuit 16, 17 during the presence of the third clock pulse, and the thyristors 18a, 18b conduct one after the other for the third cycle of the mains supply voltage.

When the third clock pulse finishes, the output of the T flip-flop 24 is immediately reset to logic 0 by the differentiator 30, thus subtracting 1,000 from the accumulated value in the accumulator 21 when the accumulated value is equal to or exceeds 1,000. The accumulator 21 is triggered after a short time delay of 0.1ms and the accumulated value now becomes 1,280, providing an overflow signal. Therefore, the T flip-flop 24 toggles to provide a logic 1 output for enabling the AND gate 29 to provide another firing pulse when the fourth clock pulse arrives.

The control device 20 operates in a similar manner for the fourth and fifth clock pulses as for the third clock pulse. For each of the fourth and fifth clock pulses, overflow occurs and a firing pulse is provided.

The thyristors 18a, 18b conduct one after the other for each of the fourth and fifth cycles of the mains supply voltage.

0.1ms after the fifth clock pulse finishes, the accumulated value in the accumulator 21 becomes 800, and the T flip-flop 24 does not toggle. Therefore no firing pulse is provided when the sixth clock pulse arrives. The arrangement is such that the control device 20 operates in a similar manner for the sixth to ninth clock pulses as for the second to fifth clock pulses, and also in a similar manner for every subsequent groups of four clock pulses until the last groups ending with the 25th clock pulse. The accumulated value will be 1,000 when the 26th clock pulse arrives, and therefore one additional firing pulse is provided for the 26th clock pulse.

It is appreciated that there are 19 firing pulses spread over the second to the 26th clock cycles, and the average rms value of the load voltage is 76% of the maximum rms value when the thyristors 18a, 18b conduct alternately throughout. When the output of the T flip-flop 24 is reset to logic O immediately when the 26th clock pulse finishes, the accumulated value in the accumulator 21 becomes 760 again, as when the first clock pulse finishes. As a result, the operation of the control device 20 will repeat in an identical manner for every subsequent group of 25 clock cycles as for the first 25 clock cycles (the second to 26th), and the 76% average rms value of the load voltage will be maintained.

The T flip-flop 24 has a preset input 32 which when enabled will set the output of the flip-flop 24 to logic 1. When it is desired to apply the mains supply voltage continuously across the load 19, a logic 1 signal is continuously applied to the preset input 32 of the T flip-flop 24. This will maintain the output of the T flip-flop 24 at logic 1, and the AND gate 29 will provide a firing pulse for each clock pulse.

Figure 4:
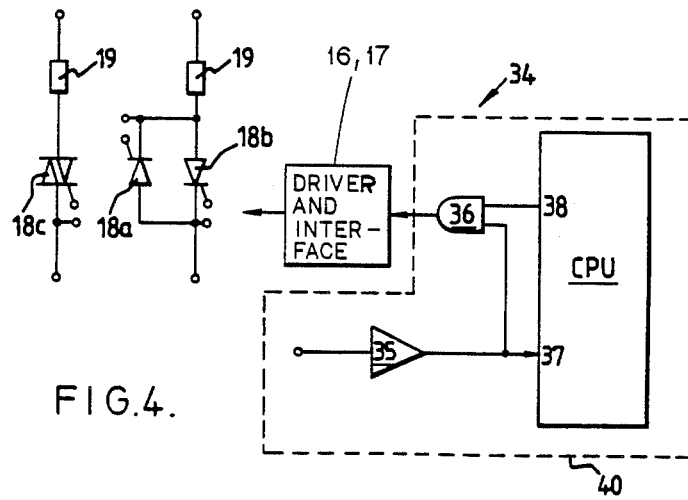
FIG. 4 is a schematic circuit diagram of a third embodiment of a control device in accordance with the invention.

The control device 20 is implemented by logic circuit 39, and therefore can also be implemented by a microprocessor-based circuit 40, such as a computer, as shown in FIG. 4.

FIG. 4 shows a third embodiment of a control device 34 which comprises a central-processing-unit or CPU 34 of a computer, a zero voltage comparator 35 and an AND gate 36. The zero voltage comparator 35 provides, in a manner identical with that of the comparator 25 of the control device 20, a clock signal to an interrupt input 37 of the CPU. The AND gate 36 has two inputs connected respectively to the outputs of the zero voltage comparator 35 and the CPU. The output of the AND gate 36 is connected to the driver and interface circuit 16, 17 and, in turn, to the thyristors 18a and 18b, as for the control device 10.

The CPU is programmed to perform a function which is similar to the combined function of the accumulator 21, the T flip-flop 24, the impulse converter 30 and the time delay element 31 of the control device 20. The input of the control signal to the CPU could be effected by means of a keyboard, or could be generated internally according to the conditions of the load 19. The control device 34 has the advantage that the base value of the control signal can be varied.

It is envisaged that the two thyristors 18a and 18b can be replaced by a triac 18c which is triggered by signals ta₁ and ta₂. In this case the pulse transformer 17' can be dispensed with.

The control device of the invention has the advantage of providing more settings, potentially an infinite number of settings in the analogue device of FIG. 1, of the rms value of an a.c. voltage applied to a load by means of thyristors or triacs, whilst keeping the fluctuation of the load voltage to a minimum. Where the load is a heating device, the temperature of the device can be maintained in one of a wide range of settings with the minimum fluctuation.

The invention is described by way of example only, and various modifications and/or alterations will be apparent to those skilled in the art without departing from the scope of the invention as defined by the accompanying claims.

What is claimed is:

1. A control device for switching a thyristor or the like in a circuit including an a.c. voltage source, comprising firing signal means having an input for receiving control signals, an output for providing firing signals for a said thyristor, and a detector for detecting zero-crossings of an a.c. voltage provided by the a.c. voltage source, wherein said firing signal means further comprises accumulating means for accumulating the control signals and for providing a said firing signal when both the detector detects a zero-crossing of the a.c. voltage and the value of the accumulated control signals is equal to or exceed a first predetermined value, and subtracting means for subtracting a second predetermined value from the value of the accumulated control signals when a said firing signal is provided.

2. A control device as claimed in claim 1, wherein said firing signal means comprises an electric charge balance voltage-to-frequency converter which is synchronised with the zero-crossings of the a.c. voltage to provide said firing signals at the zero-crossings.

3. A control device as claimed in claim 2, wherein said firing signal means comprises a voltage integrator circuit including a capacitor and a data flip-flop, the output of said integrator circuit being connected to the D input of the data flip-flop, and wherein the capacitor is charged up to accumulate the control signals as electric charge, and is arranged to be discharged under substantially constant voltage condition for a substantially constant period of time to subtract a said second predetermined quantity of electric charge.

4. A control device as claimed in claim 3, wherein the discharging of the capacitor is controlled by a switch, when in use, is closed in response to the presence of firing signals.

5. A control device as claimed in claim 3 or claim 4, wherein the output of the detector is connected to the clock input of the data flip-flop, and the outputs of the data flip-flop and the detector are logically coupled together to provide the firing signals.

6. A control device as claimed in claim 2, wherein the detector comprises an operational amplifier, and a pair of diodes connected on opposite direction respectively between two inputs of the operational amplifier, the detector, when in use, converts the a.c. voltage into a clock signal which is synchronized with the a.c. voltage.

7. A control device as claimed in claim 1, wherein said firing signal means comprises a digital accumulator having an input for receiving the control signals and an output for providing the firing signal when the total value of accumulated control signals overflows a said second predetermined value, the operation of the accumulator being triggered by the detector.

8. A control device as claimed in claim 7, wherein said firing signal means further comprises a toggle flip-flop which is connected to the output of the accumulator, the firing signals being provided at the output of the toggle flip-flop, and wherein the output of the detector is connected to a clear input of the toggle flip-flop so that the output of the toggle flip-flop is resettable to subtract a said second predetermined value from the accumulated control signal when overflow occurs.

9. A control device as claimed in claim 8, wherein the output of the detector is connected to a clock input of the accumulator via a time delay element so that the output of the toggle flip-flop is reset before the accumulator is triggered to operate.

10. A control device as claimed in claim 8 or claim 9, wherein the outputs of the toggle flip-flop and the detector are logically coupled together to provide the firing signals.

11. A control device as claimed in claim 7, wherein said firing signal means further comprises a register having a binary-coded-decimal input, and the accumulator has three binary-coded-decimal inputs which are arranged to be selectively connected to the input of the register.

12. A control device as claimed in claim 1, wherein said firing signal means comprises a microprocessor-based circuit, which is programmable to accumulate the control signals, provide the firing signals, and subtract a said second predetermined value from the accumulated control signals.

13. A control device as claimed in claim 12, wherein the microprocessor-based circuit comprises a central-processing-unit of a computer a zero voltage comparator and an AND gate, the central-processing-unit having an interrupt input and an output, and wherein the output of the central-processing-unit is connected to a first input of the AND gate, and the output of the zero voltage comparator is connected to the interrupt input of the central-processing-unit and a second input of the AND gate, whereby the central-processing-unit is triggerable by the zero voltage comparator to start operation and to provide said firing signals via the AND gate.

14. A method of controlling the rms voltage applied to a load, the rms voltage being a percentage of the rms voltage of an a.c. supply, the method comprising supplying discontinuously half cycles or multiples thereof of the a.c. supply, wherein the supply of said half cycles or multiples thereof is controlled by an accumulation means, said accumulation means accumulating regularly signals of a first value, said signals being a percentage, equal to the aforesaid percentage of a second value, and a said half cycle or multiples thereof being applied to the load when the total value of the accumulated signals is equal to or exceeds the second value, the second value then being subtracted from the accumulated signal value.

15. Apparatus for controlling the rms voltage applied to a load from an a.c. source, said apparatus comprising switching means for connecting said source across said load for half cycles or multiples thereof of said source voltage, wherein said switching means comprises input means for receiving an input signal of a first predetermined value which is a percentage, equal to or less than 100%, of a second predetermined value, accumulation means for accumulating a first predetermined value into the accumulation means for each half cycle or multiples thereof, trigger means for supplying a said half cycle or multiples thereof to the load when the value of the accumulated signals in the accumulation means is equal to or exceeds the second predetermined value, and reset means for subtracting a said second predetermined value from the accumulated value.

* * * * *